United States Patent [19]
Horie et al.

[11] Patent Number: 5,568,098
[45] Date of Patent: Oct. 22, 1996

[54] FREQUENCY SYNTHESIZER FOR USE IN RADIO TRANSMITTER AND RECEIVER

[75] Inventors: Hiroshi Horie, Hino; Tsutomu Tobita, Oume, both of Japan

[73] Assignee: Toshiba Corporation, Kanagawa-ken, Japan

[21] Appl. No.: 505,326

[22] PCT Filed: Mar. 18, 1994

[86] PCT No.: PCT/JP94/00441

§ 371 Date: Aug. 11, 1995

§ 102(e) Date: Aug. 11, 1995

[87] PCT Pub. No.: WO94/22224

PCT Pub. Date: Sep. 29, 1994

[30] Foreign Application Priority Data

Mar. 18, 1993 [JP] Japan .................... 5-58659

[51] Int. Cl.$^6$ ................ H03L 7/08; H03L 7/18
[52] U.S. Cl. ................ 331/16; 331/8; 331/77; 327/105; 327/156; 455/76; 455/260; 455/290; 455/319
[58] Field of Search ............ 331/8, 16, 18, 331/19, 37, 41, 74–77; 333/218; 327/105, 156–159; 455/75, 76, 86, 87, 118, 260, 290, 293, 318–320, 323

[56] References Cited

U.S. PATENT DOCUMENTS

| | | | |
|---|---|---|---|
| 2,352,455 | 6/1944 | Summerhayes | 331/76 |
| 2,560,558 | 7/1951 | Davis | 455/87 |
| 2,654,832 | 10/1953 | Robinson | 455/87 |
| 2,698,385 | 12/1954 | Carter | 331/76 X |
| 3,789,302 | 1/1974 | Rearwin et al. | 331/76 X |
| 3,921,056 | 11/1975 | Mahoney | 333/218 |
| 4,039,968 | 8/1977 | Emshwiller | 331/76 X |
| 4,176,332 | 11/1979 | Bachert | 333/218 |
| 4,231,116 | 10/1980 | Sekiguchi et al. | 455/87 |

FOREIGN PATENT DOCUMENTS

| | | |
|---|---|---|
| 43-22253 | 9/1968 | Japan . |
| 55-42465 | 3/1980 | Japan . |
| 56-76640 | 6/1981 | Japan . |
| 61-157008 | 7/1986 | Japan . |

*Primary Examiner*—David Mis
*Attorney, Agent, or Firm*—Finnegan, Henderson, Farabow, Garrett & Dunner, L.L.P.

[57] ABSTRACT

A phase comparator (91) makes a phase comparison between a frequency-divided signal from a frequency divider (98) and a reference oscillation signal from a reference signal oscillator (90). The phase error signal obtained from the comparison is passed through an LPF (92) to yield a frequency control signal, which is applied to a VCO (94). An oscillated signal from is frequency-multiplied by a frequency multiplier (96). The multiplied output oscillation signal SO is frequency-divided by the frequency divider (98) and output to the phase comparator (91). The multiplied output oscillation signal SO is sent out to a receiver circuit (43) and a transmitter circuit (45).

10 Claims, 7 Drawing Sheets

FREQUENCY SYNTHESIZER FOR USE IN RADIO TRANSMITTER AND RECEIVER

TECHNICAL FIELD

The invention relates to a frequency synthesizer, used in for example an oscillator of a transmitting system and a local oscillator within a frequency converter circuit of a receiving system in a radio communication device, for multiplying and supplying an oscillated signal which has been stabilized in frequency by a PLL (phase locked loop) to such transmitting and receiving systems.

BACKGROUND ART

Conventionally, a frequency synthesizer of this kind is formed of a PLL comprising an oscillator using a quartz-crystal oscillator, a phase comparator, a divider (programmable one), a VCO (voltage controlled oscillator), etc. Such a frequency synthesizer generates and outputs an oscillation signal of a frequency variable by constant spacings by locking the VCO on the basis of the phase difference between a reference oscillation signal from the oscillator and the output oscillation signal and using the divider.

Figure 1:
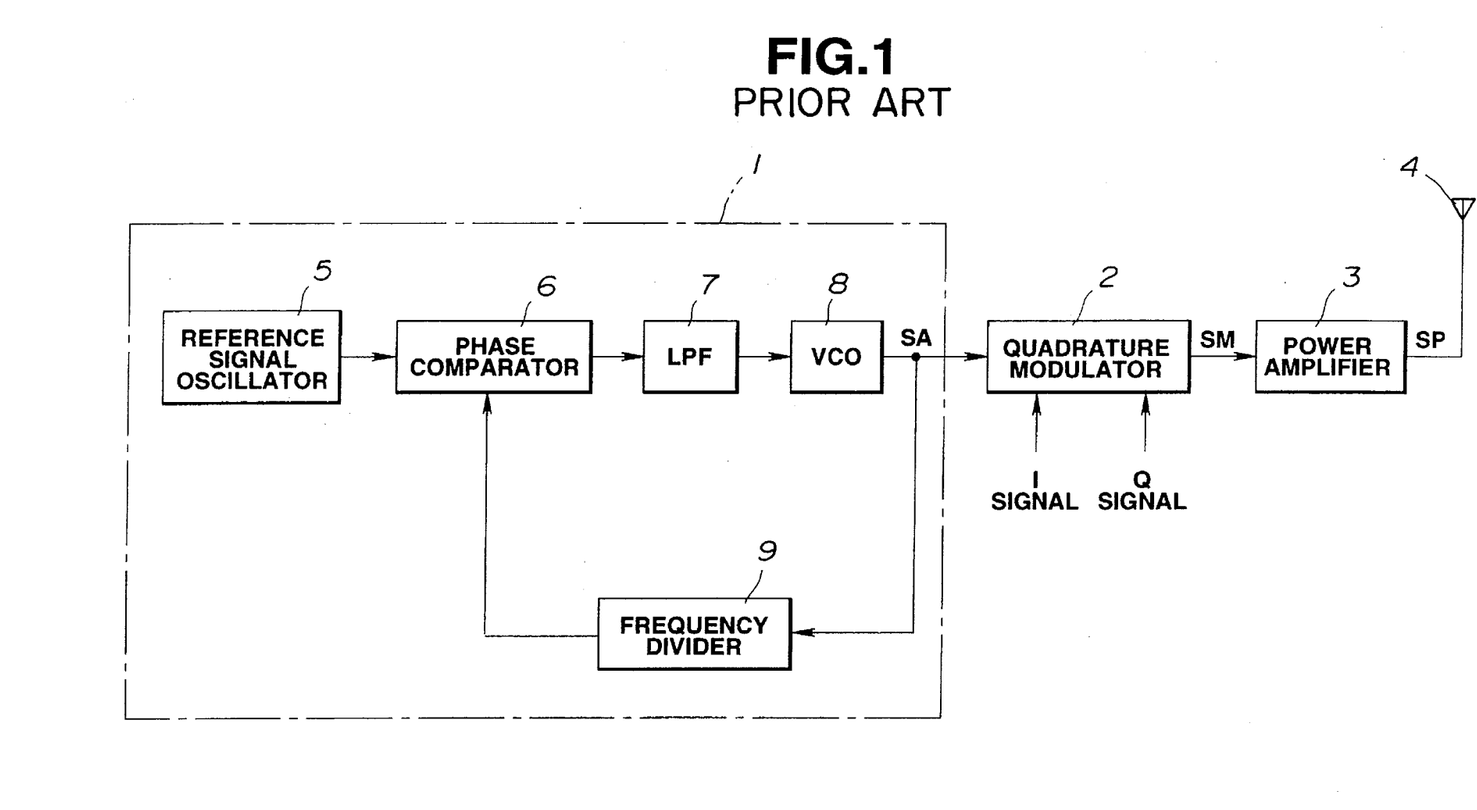
FIG. 1 is a block diagram showing an arrangement of a radio transmitter which utilizes a prior art frequency synthesizer.

FIG. 1 is a block diagram showing an arrangement of a radio transmitter using a prior art frequency synthesizer. In FIG. 1, the radio transmitter comprises a frequency synthesizer 1 for supplying an stable output oscillation signal SA with a frequency variable by constant spacings, a quadrature modulator 2 for applying QPSK (quadrature phase shift keying) or QAM (quadrature amplitude modulation) to the output oscillation signal SA by using phase angle modulation signals (I and Q signals), a power amplifier 3 for amplifying the modulated high frequency signal SM from the quadrature modulator 2 for transmission, and an antenna 4 for radiating the high frequency electric power SP from the power amplifier 3 as radio wave. Also, the frequency synthesizer 1 is provided with a reference signal oscillator 5 for oscillating a reference signal, and a phase comparator 6 for making a phase comparison between a frequency-divided signal and the reference oscillation signal from the reference signal oscillator 5. And, it is also provided with a low pass filter (LPF) 7 for removing undesirable harmonics and noise from a phase error signal from the phase comparator 6 and supplying a DC voltage, a voltage controlled oscillator (VCO) 8 for sending out an output oscillation signal SA with its frequency locked by the DC voltage from the LPF 7, and a frequency divider 9 for frequency-dividing the output oscillation signal so as to provide a frequency-divided signal which is frequency-variable by constant spacings and for supplying the frequency-divided signal to the phase comparator 6.

Here, we discuss operation of the radio transmitter or a prior art example, in the following.

The phase comparator 6 in the frequency synthesizer 1 compares the phases of the reference oscillation signal from the reference signal oscillator 5 and the frequency-divided signal from the frequency divider 9. The phase error signal obtained from the comparison is passed through an LPF 7, which removes undesirable harmonics and noise from the phase error signal from the phase comparator 6 to yield a DC voltage, that is, a frequency controlling signal, which is applied to the control terminal of a VCO 8. It is noted that the amplitude and phase characteristics of the LPF 7 determines the response and synchronization characteristics of the PLL in this frequency synthesizer 1. That is, selecting the inductance and capacitance of the LPF is to set a time characteristic of the frequency divider 9 with respect to frequency shift. The frequency synthesizer 1 supplies a stable output oscillation signal SA with a frequency variable by constant spacings to the quadrature modulator 2, which applies modulation such as (QPSK and (QAM with phase angle modulation signals (I and Q signals) to the output oscillation signal SA for output. The modulated radio signal SM is power amplified by the power amplifier 3 to radiate the amplified radio signal power SP through the antenna 4 as radio wave.

In such transmitter, the radio signal power SP from the power amplifier 3 is relatively large. For this reason, in order to prevent undesirable radiation leaking from the radio signal power from the power amplifier 3 and radio wave radiated from the antenna 4 from going round into the other circuit including the frequency synthesizer 1, these circuits are shielded with a metal shield case. In spite of the shield, undesirable radiation and/or radiated radio wave may go into the resonator such as a dielectric resonant element which determines the oscillation frequency in the VCO 8 in the frequency synthesizer 1. This will cause the oscillation signal of the VCO 8 to be phase modulated, resulting in variation in the resonance frequency. Accordingly, the error rate in demodulating in a receiver the radio wave which has been modulated in QPSK by the quadrature modulator 2 will become high.

Figure 2:
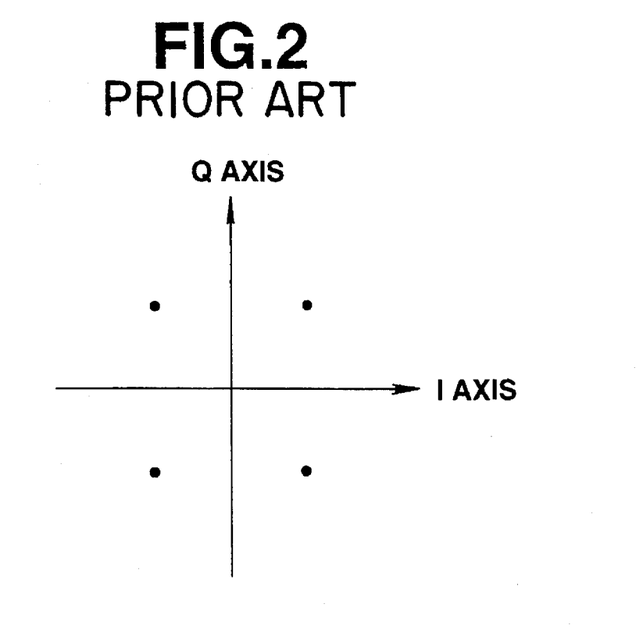
FIG. 2 is a diagram showing a signal point arrangement on an IQ plane on which modulated radio signals were demodulated in a receiver and plotted.
Figure 3:
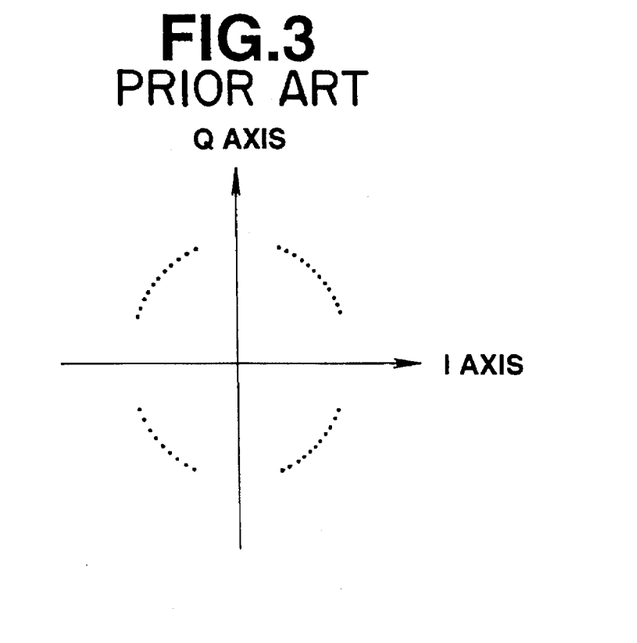
FIG. 3 is a diagram showing a signal point arrangement on an IQ plane on which modulated radio signals SM in case of the occurrence of frequency variation were demodulated in a receiver and plotted.

FIG. 2 is a phase plane diagram defined by I and Q axes on which what the modulated radio signal SM is demodulated into in a receiver is plotted, while FIG. 3 is a phase plane diagram defined by I and Q axes on which what the modulated radio signal SM in case of variations in the resonance frequency is demodulated into in a receiver is plotted. In FIG. 2, the demodulated version of the modulated radio signal SM in the ideal state without variation in the resonance frequency is shown as 4 phases (4 points) on an IQ plane. In this ideal state, the points plotted on the IQ plane are sufficiently far from one another, yielding a low error rate of demodulated data in a receiver.

On the other hand, occurrence of variation in the modulated radio signal SM which has been affected by the variation in the resonance frequency, that is, occurrence of frequency variation in the output oscillation signal SA from the frequency synthesizer 1 would cause the phase of the output oscillation signal SA to change, resulting in each of demodulated data of this case, when plotted on the IQ plane, spreading on the circumference of a circle as shown in FIG. 3. In this case, demodulated data may even go across the I or Q axis, which makes very high the error rate of demodulated data in the receiver. Even when demodulated data do not go so far as to cross the I or Q axis, a variation in the phase in demodulation may cause the error rate of demodulated data to rise.

Though such variation in the frequency of the output oscillation signal SA from the frequency synthesizer 1 is corrected by PLL operation, since the modulation is performed in the quadrature modulator 2, the phase and the amplitude vary with time at a rate responsive to the frequency of the phase angle modulated signal. Further, for the purpose of more efficient utilization of frequency, the modulation tends to be made at a higher rate. Thus, the frequency of the output oscillation signal SA varies with time so fast that the frequency variation of the output oscillation signal SA from the frequency synthesizer 1 can not be often suppressed by PLL operation. Radio communication devices have been proposed which are so arranged, in order to improve the frequency variation, that the transmission frequency and the oscillation frequencies of the frequency synthesizers are different.

Figure 4:
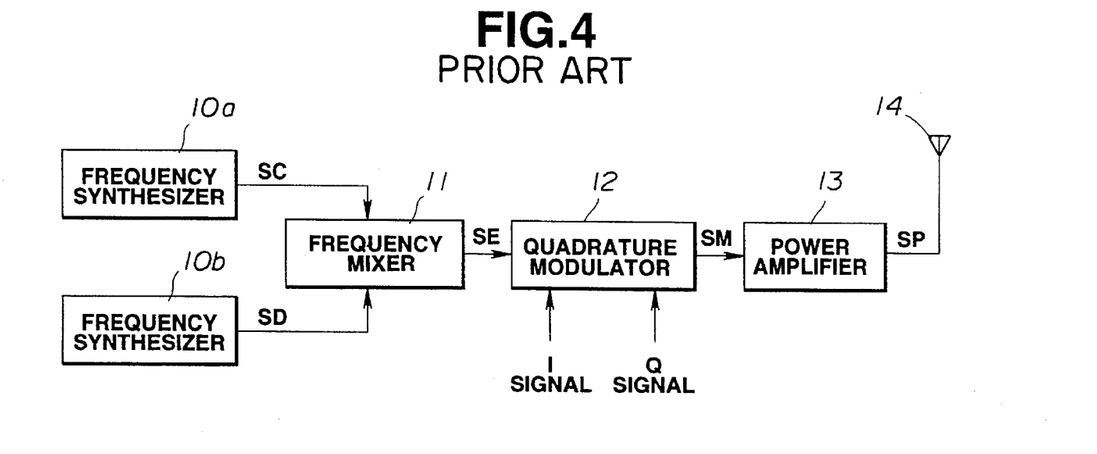
FIG. 4 is a diagram showing an arrangement of a conventional radio transmitter in which the transmission frequency and the oscillation frequency of the frequency synthesizer are different.

FIG. 4 is a block diagram showing an arrangement of such a radio communication device wherein the transmission frequency and the oscillation frequencies of the frequency synthesizers are different. In FIG. 4, the device comprises two frequency synthesizers 10a and 10b, and a frequency mixer 11 for applying an addition or a subtraction to two output oscillation signals SC and SD from the frequency synthesizers 10a and 10b to yield sum frequencies or difference frequencies, respectively, that is, to output a stable output oscillation signal SE with a frequency variable by constant spacings. The radio communication device further comprises a quadrature modulator 12 for applying QPSK (quadrature phase shift keying) or QAM (quadrature amplitude modulation) to the output oscillation signal SE by using phase angle modulation signals (I and Q signals), a power amplifier 13 for amplifying the modulated high frequency signal SM for transmission, and an antenna 14 for radiating the high frequency electric power SP from the power amplifier 13 as radio wave.

Now, we discuss operation of the prior art device.

The output oscillation signals SC and SD from the two frequency synthesizers 10a and 10b are mixed by the frequency mixer 11 to output the stable output oscillation signal of either sum frequencies or difference frequencies which are different from one another by a constant frequency. The output oscillation signal SE is applied together with phase angle modulation signals (I and Q signals) to the quadrature modulator 12 and thereby modulated in QPSK or QAM to produce a modulated radio signal SM, which in turn is power amplified by the power amplifier 13. The resultant radio signal power SP is radiated through the antenna 14 as radio wave. Since the frequency of the radio signal power SP and the frequencies of the output oscillation signals SC and SD are different from one another in this operation, it is possible to avoid disturbance caused in case when spurious leaking from the radio signal power SP from the power amplifier 13 and the radio wave radiated from the antenna 14 go around into the VCO's. Thus, the frequency variation of the VCO's in the frequency synthesizers 10a and 10b is reduced.

Since this arrangement requires two frequency synthesizers 10a and 10b, the structure of the circuit becomes complicated. That is, the number of components increases arresting the reduction in the size of the device, which is especially disadvantageous for application in a portable wireless equipment. Producing sum or difference frequencies by using the frequency mixer 11 makes harmonic spurious apt to be generated, causing the generated spurious to mix in the receiving part, which may disable some receiving channel from receiving. In this case, the elimination of spurious component requires a band pass filter, above all, one with a sharp skirt characteristic, leading to need for complex operation. A radio communication equipment in which the output oscillation signal from a frequency synthesizer is frequency multiplied for improvement is well known (See, for example, Japanese Utility Model Application Disclosure No. Hei2-1930 disclosed in 1990).

Figure 5:
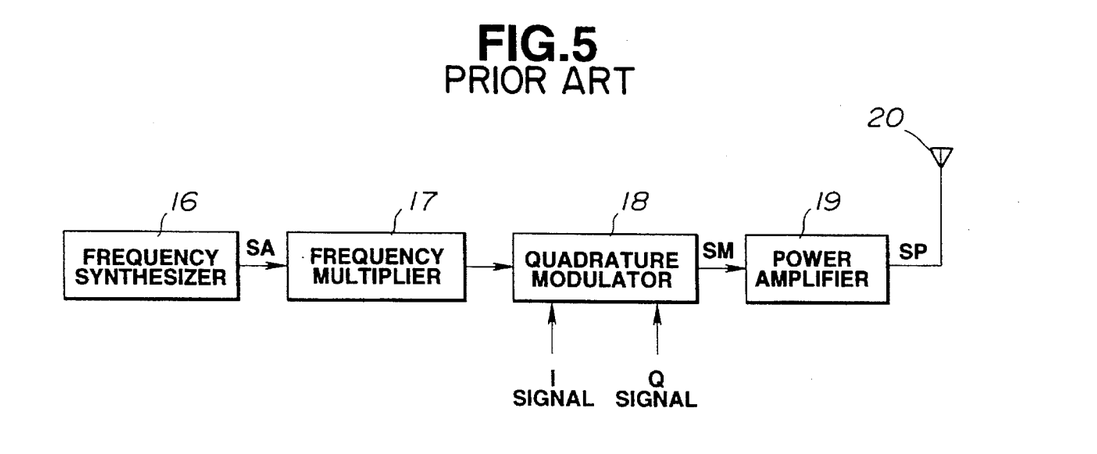
FIG. 5 is a diagram showing an arrangement of a conventional radio communication equipment in which the output oscillation signal from the frequency synthesizer is frequency-multiplied.

FIG. 5 is a block diagram showing an arrangement of a radio communication equipment in which the output oscillation signal from a conventional frequency synthesizer is frequency multiplied. In FIG. 5, the equipment comprising a frequency synthesizer 16 for supplying an output oscillation signal SA, a frequency multiplier 17 for frequency multiplying the output oscillation signal SA from the frequency synthesizer 16, a quadrature modulator 18 for modulating the output oscillation signal SE in (QPSK or QAM by using phase angle modulation signals (I and Q signals), a power amplifier 19 for amplifying the modulated radio signal SM for transmission, and an antenna 20 for radiating the high frequency electric power SP from the power amplifier 19 as radio wave.

Now, we discuss operation of the conventional radio equipment in the following.

The output oscillation signal SA from the frequency synthesizer 16 is frequency multiplied by the frequency multiplier 17 and modulated by the quadrature modulator 18. The modulated radio signal SM is amplified in the power amplifier 19 to produce an amplified radio power SP, which is radiated through the antenna 20 as radio wave. Since the frequency of the radio power SP, the transmission frequency, differs from that of the output oscillation signal SA from the frequency synthesizer 16 in this case, if spurious leaking from the radio power SP from the power amplifier 19 or radio wave radiated from the antenna 20 goes around into the VCO in the frequency synthesizer 16, variation in the frequency will not take place within the VCO in the frequency synthesizer 16.

However, in this radio communication equipment, the transfer function of the frequency synthesizer 16 is approximately linear, and so the quickness of shifting the frequency which can be represented by natural frequency has to be made identical regardless of whether the equipment is provided with a frequency multiplier 17 or not. That is, thus arranged radio communication equipment will use a frequency synthesizer capable of shift its frequency as quickly as the case when the equipment has no frequency multiplier 17 to make use of any necessary part of a characteristic curve for the linear transfer function thereof.

In the frequency synthesizer 16, constant-spacing radio channels is produced by incrementing or decrementing the divisor of the frequency divider at each step. The phase comparator in the frequency synthesizer 16 is suited to be integrated, and so is generally constructed by using logic IC's. Accordingly, an actual phase comparator shapes the waveform of input signal into a rectangular waveform and compares phases at the rising or falling edge of the waveform. That is, the phase error is detected once every cycle of the signal input to the phase comparator.

Thus, the natural frequency can not be set higher than the phase comparison frequency. In the frequency synthesizer 16, it is necessary to apply to the VCO, as a controlling voltage, the only components of the phase comparator output which are lower than the natural frequency by actually removing pulse components output every phase comparison cycle from the phase comparison output. Therefore, the natural frequency needs to be set sufficiently smaller than the phase comparison frequency. Furthermore, in consideration of the multiplication of output oscillation signal SA, the phase comparison frequency must be set 1/M of the radio channel spacing.

For this reason, if constant interval radio channels are to be realized, the upper bound of the realizable natural frequency of the frequency synthesizer 16 will become as low as 1/M of the upper bound of the realizable natural frequency of the frequency synthesizer in the arrangement shown in FIG. 1. On the other hand, in order for a frequency synthesizer to shift its frequency during a TDMA burst used in digital communication, the shift needs to be more quick. Thus, the arrangement shown in FIG. 5 copes with the frequency variation caused by disturbance of spurious leaking from radio power SP or radio wave radiated from the antenna 20 going around into the VCO, whereas it can not disadvantageously respond to a quick shift of radio channels.

These and other disadvantages of the prior art are overcome in accordance with the present invention. An object of the invention is to provide a frequency synthesizer which enables a quick shift of frequency channels without making larger the scale of the device and which does not require any specific frequency band characteristic of a band pass filter in extracting and dividing a signal of a predetermined band which has been multiplied and so permits the use of a widely used filter, resulting in a reduction in cost.

DISCLOSURE OF THE INVENTION

These and other objects are achieved according to a frequency synthesizer of the invention.

A frequency synthesizer according to an aspect of the invention comprises reference oscillator means for supplying a reference oscillation signal, phase comparator means for outputting a phase error signal between a frequency-divided signal and the reference oscillation signal, a loop filter for producing a control signal from the phase error signal, voltage controlled oscillator means for sending out an oscillation signal with a frequency corresponding to the value of the control voltage, frequency multiplying means for frequency multiplying the oscillation signal to sending out the frequency-multiplied oscillation signal, and frequency dividing means for frequency dividing the frequency-multiplied oscillation signal which has been multiplied by the frequency multiplying means and supplying it to the phase comparator means.

It is noted that the frequency-multiplied signal derived from the output terminal of the frequency multiplying means is fed to the frequency dividing means. The frequency synthesizer further comprises high frequency signal processing means connected to said output of said frequency multiplying means for supplying an output oscillation signal, wherein a signal derived from an input terminal of said high frequency signal processing means is fed to said frequency dividing means.

A frequency synthesizer according to another aspect of the invention comprises reference oscillator means for supplying a reference oscillation signal, a phase comparator means for outputting a phase error signal between a frequency-divided signal and the reference oscillation signal, a loop filter for producing a control signal from the phase error signal, voltage controlled oscillator means for sending out an oscillation signal with a frequency corresponding to the value of the control voltage, frequency multiplying means for frequency multiplying the oscillation signal to sending out the frequency-multiplied oscillation signal, frequency dividing means for frequency dividing the frequency-multiplied oscillation signal and supplying it to the phase comparator means, and a band pass filter for letting a predetermined frequency band of the frequency-multiplied signal pass.

Further, the second-mentioned frequency synthesizer is so arranged that it outputs the frequency-multiplied signal supplied to an input terminal of the band pass filter, that is, outputs the frequency-multiplied signal as an output oscillation signal from between an output terminal of the frequency multiplying means and the input terminal of the band pass filter.

A frequency multiplier may comprise an input-side resonance circuit of the same frequency as that of the oscillation signal from the voltage controlled oscillator means, and an amplifier/frequency-multiplier circuit for amplifying and frequency-multiplying the oscillation signal from the input-side resonance circuit. Another frequency multiplier may comprise an amplifier/frequency-multiplier circuit for amplifying and frequency-multiplying the oscillation signal, and an output-side resonance circuit for resonating with the frequency of the frequency-multiplied signal. Also, the frequency multiplier is constructed using transistors. Alternatively, a frequency multiplier may comprise an resonance circuit provided on the input side for resonating at the same frequency as that of the oscillation signal from the voltage controlled oscillator means, and a semiconductor device for distorting the signal from the resonance circuit. A still another frequency multiplier may comprise a semiconductor device for distorting the signal from the voltage controlled oscillator means to produce a frequency-multiplied signal, and an output-side resonance circuit connected to the output terminal of the semiconductor device for resonating at the frequency of the frequency-multiplied signal. In these arrangements, a variable-capacitance diode is used for the semiconductor device for distorting a frequency-multiplied signal; and used for the resonance circuit is a series or parallel resonance circuit using inductors and capacitors. Further, distributed capacitance in the circuit is used as capacitors.

Frequency dividing means is so arranged as to divide the oscillation signal from the voltage-controlled oscillator means into a signal of a frequency variable by constant spacings. The frequency dividing means is also provided with setting means for setting the frequency variable by constant spacings.

In a radio transmitter comprising means for inputting a signal to be transmitted, means for modulating the input signal from the signal inputting means, a frequency synthesizer for generating a local oscillation signal, and means for converting a signal modulated by the modulating means with the local oscillation signal into a radio frequency signal for transmission, the frequency synthesizer is so arranged as to comprise reference oscillator means for supplying a reference oscillation signal, phase comparator means for outputting a phase error signal between a frequency-divided signal and the reference oscillation signal, a loop filter for producing a control signal from the phase error signal, voltage controlled oscillator means for sending out an oscillation signal with a frequency corresponding to the value of the control voltage, frequency multiplying means for frequency multiplying the oscillation signal to sending out the frequency-multiplied oscillation signal, and frequency dividing means for frequency dividing the frequency-multiplied oscillation signal which has been multiplied by the frequency multiplying means and supplying it to the phase comparator means.

Thus, this frequency synthesizer, wherein the phase comparison frequency is equal to the radio channel spacing, is capable of shifting radio channels at almost the same rate as a conventional one. Also, the voltage controlled oscillator means, spurious leaking from the radio power and radio wave radiated from the antenna are different in frequency from one another. Accordingly, disturbance due to such undesirable radiations coming into the voltage-controlled oscillator means is hard to occur resulting in reduced variation in the frequency of the oscillation signal from the voltage-controlled oscillator means. Additionally, the structure of the frequency multiplier is simple so that it is possible to control enlargement in the scale of equipment. Also, The arrangement of this frequency synthesizer does not require any specific frequency band characteristic of a band pass filter in extracting and dividing a signal of a predetermined band which has been multiplied and so permits the use of a widely used filter, resulting in a reduction in cost.

BRIEF DESCRIPTION OF THE DRAWING

The present invention will be apparent from the following detailed description of the preferred embodiments of the invention as illustrated in the accompanying drawings. It should be understood that the embodiments shown in the accompanying drawings are not intended to limit the invention but are only intended to facilitate explanation and understanding of the invention. In the drawings.

BEST MODE FOR CARRYING OUT THE INVENTION

Frequency synthesizers according to preferred embodiments of the invention will be delineated in detail with reference to FIGS. 6 through 9 in the following.

Figure 6:
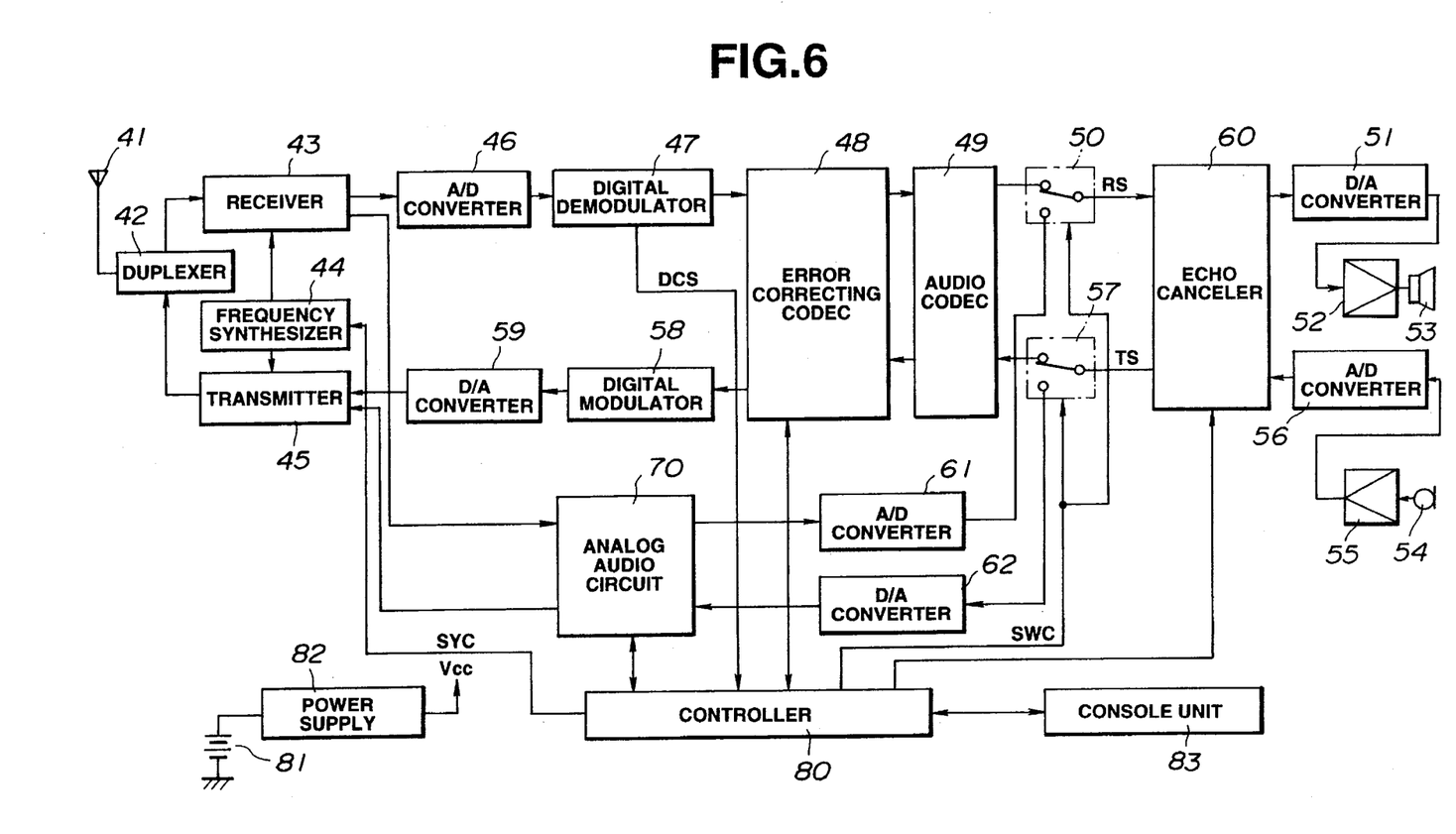
FIG. 6 is a diagram showing an arrangement of a first illustrative embodiment of a radio transmitter/receiver to which a frequency synthesizer of the invention is applied.

FIG. 6 is a diagram showing an arrangement of a first illustrative embodiment of a radio transmitter/receiver to which a frequency synthesizer of the invention is applied. This transmitter/receiver operates in either of two modes, i.e., an analog or digital mode. In the analog mode, modulation is done, for example, in FM, and the modulated wave transmitted from the transmitter is received in the receiver and FM demodulated to recover an analog audio signal and data. In the digital mode, the transmitter codes an audio signal and data to produce a coded signal, by means of which a carrier is digital modulated in for example π/4-shifted DQPSK (differentially-encoded quadrature phase shift keying) for transmission, and the receiver receives and demodulates the transmitted radio wave to produce a demodulated signal, which is decoded to recover an audio signal and data.

In FIG. 6, the receiving system in the digital mode is provided with an antenna 41 for transmitting and receiving radio wave through a wireless path to and from a base station (not shown), an antenna sharing circuit 42 and a receiver circuit 43 for frequency converting a received signal to output an intermediate frequency signal. The receiving system further comprises a frequency synthesizer 44 for sending a local oscillation signal to the receiver circuit and sending a transmission signal to a transmitter circuit, an A/D converter 46 for converting the intermediate frequency signal into the digital intermediate frequency signal, and a digital demodulator 47 for converting the digital intermediate frequency signal into a digital base band signal. The receiving system has, in common with the transmitting system in the digital mode, an error correcting codec (coder/decoder) 48 for decoding an error correcting code, an audio codec (coder/decoder) 49 for audio decoding a digital received audio signal, switching circuits 50 and 57 for switching an analog and a digital mode from one to the other, an echo canceler 60 for cancelling audio echo contained in the digital received audio signal from the switching circuit 50. The receiving system in the digital mode still further comprises a D/A converter 51 for making analog the digital received audio signal from the echo canceler 60, an amplifier 52 for amplifying the analog audio signal, and a loudspeaker 53 for outputting in audio the analog audio signal from the amplifier 52.

The transmitting system in the digital mode comprises a microphone 54, an amplifier 55 for amplifying a transmitting audio signal, an A/D converter 56 for making digital the transmitting audio signal, and a digital modulator 58 for converting the digital audio signal coded through the echo canceler 60, the switching circuit 57, the audio codec 49 and the error correcting codec 48 to produce a π/4-shifted DQPSK modulated signal. The transmitting system further comprises a D/A converter 59 for making analog the modulated signal from the digital modulator 58 and a transmitter circuit 45 for sending out radio power which has been modulated with the modulated signal from the D/A converter 59.

The receiving system in the analog mode comprises an analog audio circuit 70 for FM demodulating the intermediate frequency signal from the receiver circuit 43, and an A/D converter 61 for making digital the FM demodulated signal to supply the received analog signal RS through the switching circuit 50 to the echo canceler. The echo canceler 60 sends the received analog signal through the D/A converter 51, the amplifier 52 and the loudspeaker 53 for output in audio.

The transmitting system in the analog mode is provided with a D/A converter 62 for making analog a transmitting audio signal which has passed through the microphone 54, the amplifier 55, the A/D converter 56, the echo canceler 60 and the switching circuit 57 to supply the analog transmitting audio signal to an analog audio circuit 70. The modulated signal from the analog audio circuit 70 is transmitted through the transmitter circuit 45, the antenna sharing circuit 42 and the antenna 41.

Further, the radio transmitter/receiver is provided with controller 80 for controlling each part of the transmitting and receiving system in the digital or analog mode, a console unit 83, a battery 81 and a power supply circuit 82 for converting an output signal of the battery 81 into a predetermined operating voltage Vcc to supply the voltage Vcc to each circuit. The console unit 83 includes a group of key switches and a display device. For the display device, a liquid crystal display device is used for example.

Now, an arrangement of the frequency synthesizer 44 will be explained in detail in the following.

Figure 7:
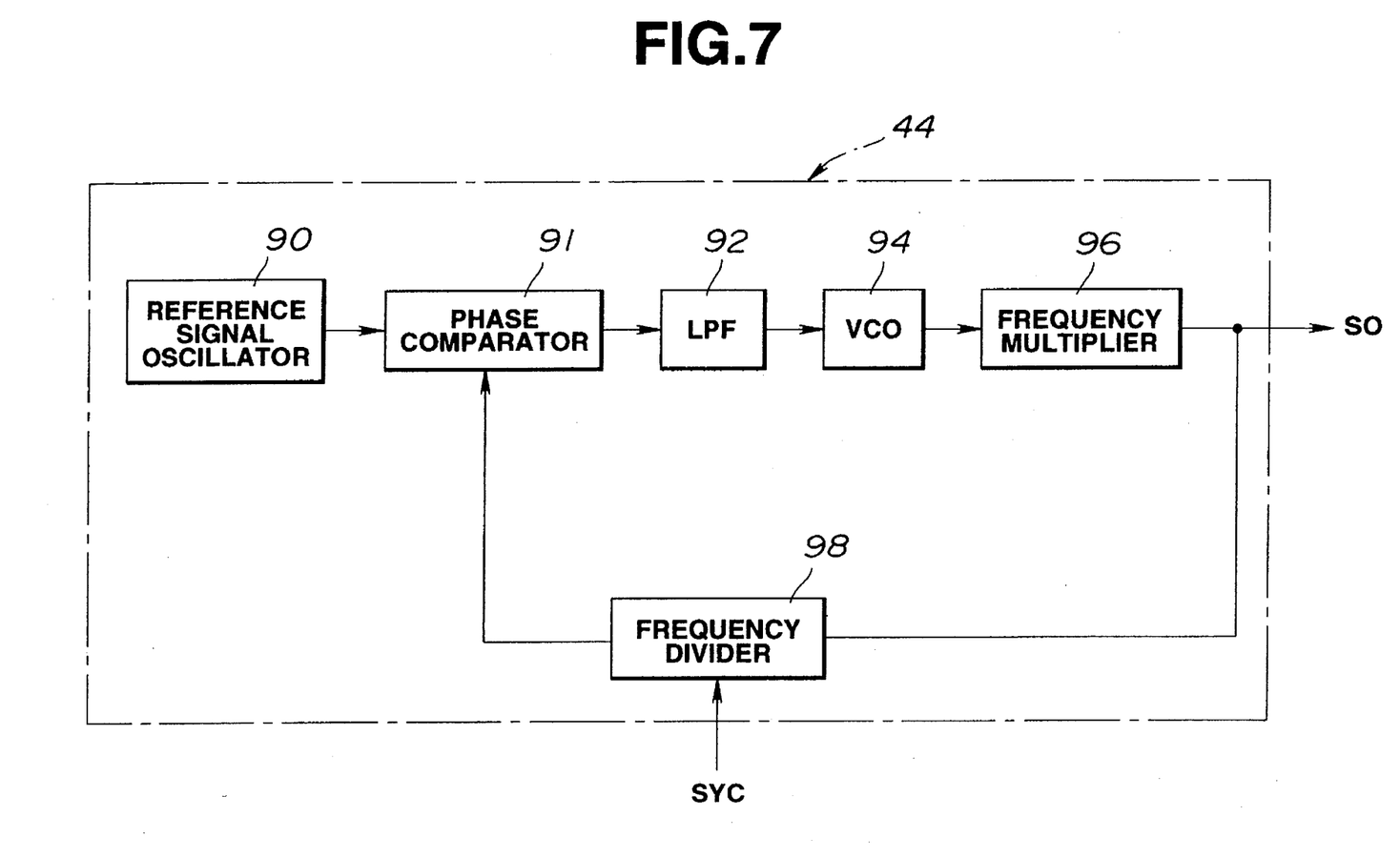
FIG. 7 is a block diagram showing a detailed arrangement of the frequency synthesizer shown in FIG. 6.

FIG. 7 is a block diagram showing an arrangement of the frequency synthesizer 44. In FIG. 7, the frequency synthesizer 1 comprises a reference signal oscillator 90 for oscillating a reference signal, and a phase comparator 91 for making a phase comparison between a frequency-divided signal and the reference oscillation signal from the reference signal oscillator 90. And, it is also provided with a low pass filter (LPF) 92 for removing undesirable harmonics and noise from a phase error signal from the phase comparator 91 and supplying a DC voltage, a voltage controlled oscillator (VCO) 94 for sending out an oscillation signal with a frequency variable by constant frequency spacings and is locked by the DC voltage from the LPF 92, a frequency multiplier 96 for supplying an output oscillation signal SO which is the frequency-multiplied-by-M version of the oscillation signal from VCO 94, and a frequency divider 98 for receiving and frequency-dividing the output oscillation signal so as to provide a frequency-divided signal with a frequency variable by constant spacings and for supplying the frequency-divided signal to the phase comparator 91.

Figure 8:
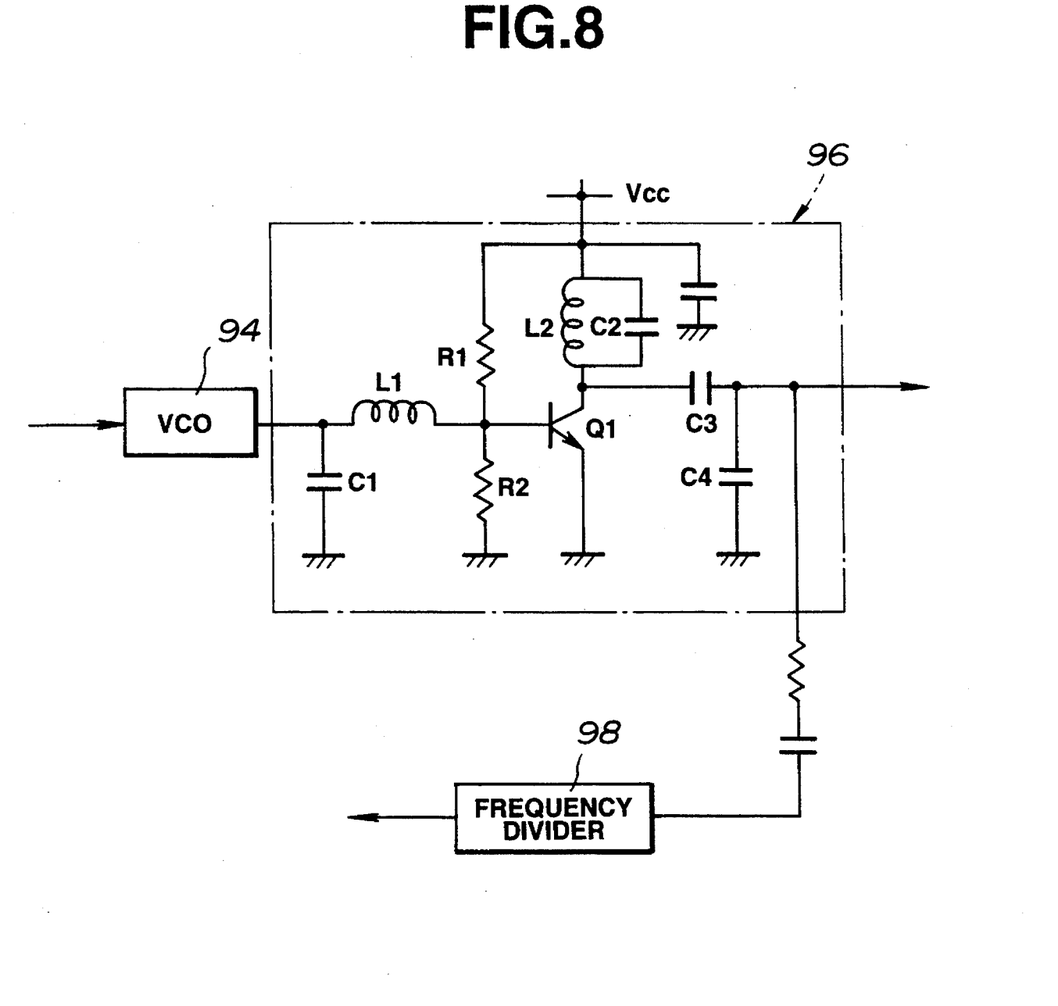
FIG. 8 is a circuit diagram showing a detailed arrangement of the frequency multiplier shown in FIG. 7.

FIG. 8 is a circuit diagram showing a detailed arrangement of a frequency multiplier. In FIG. 8, the frequency multiplier 96 comprises an input side resonance circuit (L1 and C1) with a resonance frequency identical with the frequency of the oscillation signal of VCO 94, a transistor Q1, resistors R1 and R2 for setting a bias voltage for the base of transistor Q1, an output resonance circuit (L2 and C2) connected to the collector of transistor Q1 for resonating at a multiplied frequency, a coupling capacitor C3 for outputting the resonance signal from the collector of transistor Q1 as a frequency-multiplied signal and a capacitor C4 for output impedance matching, Though the oscillation signal of VCO 94 is amplified and frequency multiplied by the transistor Q1, a variable-capacitance-diode (varactor diode) may be used in place of the transistor Q1. In this case, frequency multiplication is done by distorting the input signal making use of non-linear part of an input-output characteristic. Also, an input-output characteristic impedance matched parallel resonance circuit may be substituted for the input side resonance circuit (L1 and C1) and similarly a series resonance circuit may be used for the output resonance circuit (L2 and C2). Further, in the input side resonance circuit (L1 and C1) and the output resonance circuit (L2 and C2), L1 and L2 may be realized as coils or inductance caused by wiring pattern of the circuit substrate, and distributed capacitance may be used for C1 and C2.

Now, we discuss operation of the frequency synthesizer 44 in the following.

In FIG. 7, the phase comparator 91 in the frequency synthesizer 44 compares the phase of the reference oscillation signal output by the reference signal generator 90 with that of a signal frequency-divided by the frequency divider 98 to produce a phase error signal. The phase error signal is passed through LPF 92 to produce a DC voltage or a frequency control voltage, which is applied to the control terminal of VCO 94. In this case, undesirable harmonics and noises contained in the phase error signal from the phase comparator 91 are eliminated to output a DC voltage by the LPF 92 disposed between the phase comparator 91 and VCO 92. Thus, the characteristics of the frequency synthesizer with respect to response and synchronization is dependant upon the amplitude and phase characteristics of LPF 92. For example, by selecting capacitance and inductance of LPF 92, a characteristic such as time required for a frequency shift by the frequency divider 98 is set. Next, an oscillation signal from the VCO 94 is multiplied in frequency by the frequency multiplier 96 to produce a signal of a predetermined frequency, which is fed to the receiver circuit 43 and the transmitter circuit 45. In the frequency multiplier 96 as shown in FIG. 8 the oscillation signal of VCO 94 is fed to the input side resonance circuit (L1 and C1), therein raised by a factor of Q in voltage, and then amplified by the transistor Q1. A frequency-multiplied signal ST which has been multiplied by means of the resonance frequency of the output resonance circuit (L2 and C2) has its DC component removed and at the same time has its impedance matched to that of the following stage for output by the capacitors C3 and C4.

Thus, the stable output oscillation signal SO which is generated by the frequency synthesizer 44 and is variable in frequency by constant spacings is fed to the receiver circuit 43 and the transmitter circuit 45. In this case, the control of the controller 80 is such that the output signal SO from the frequency synthesizer 44 is fed, at the time of reception to the receiver circuit 43 under the suspension of feeding to the transmitter circuit 45, and at the time of transmission to the transmitter circuit 45 under the suspension of feeding to the receiver circuit 43. Especially at the time of reception, unreceivable channel is prevented from being caused by the effect of a signal from the transmitter circuit 45 or spurious.

In the operation described above, fed to the frequency divider 98 is the output oscillation signal SO which is identical to the radio transmission frequency. The frequency divider 98 divides in frequency the output oscillation signal SO identical to the radio transmission frequency to feed the phase comparator 91. This causes the phase comparison frequency to be identical to the radio channel frequency. Therefore, frequency channels can be shifted as quickly as in case of a conventional frequency synthesizer in which the oscillation frequency of the VCO is identical to the radio transmission frequency, that is, frequency multiplication of the oscillation signal of the VCO is not performed.

Further, in the illustrative embodiment, the frequency of the oscillation signal of VCO 94 is different from those of spurious which may caused by the radio power from the transmitter circuit 45 and radio wave radiated from the antenna 41. This makes hard to occur disturbance which will occur when undesirable spurious or radio wave go around into VCO 94 in the frequency synthesizer 44. Therefore, frequency variation in the oscillation signal of VCO 94 becomes vary small. Also, the realization of this requires only a little increase in the system size since the frequency multiplier 96 of this arrangement can be formed with a transistor or a variable-capacitance diode, and resonance circuits and so forth.

Now, we discuss a frequency synthesizer 44 in a second illustrative embodiment of the invention in the following.

Figure 9:
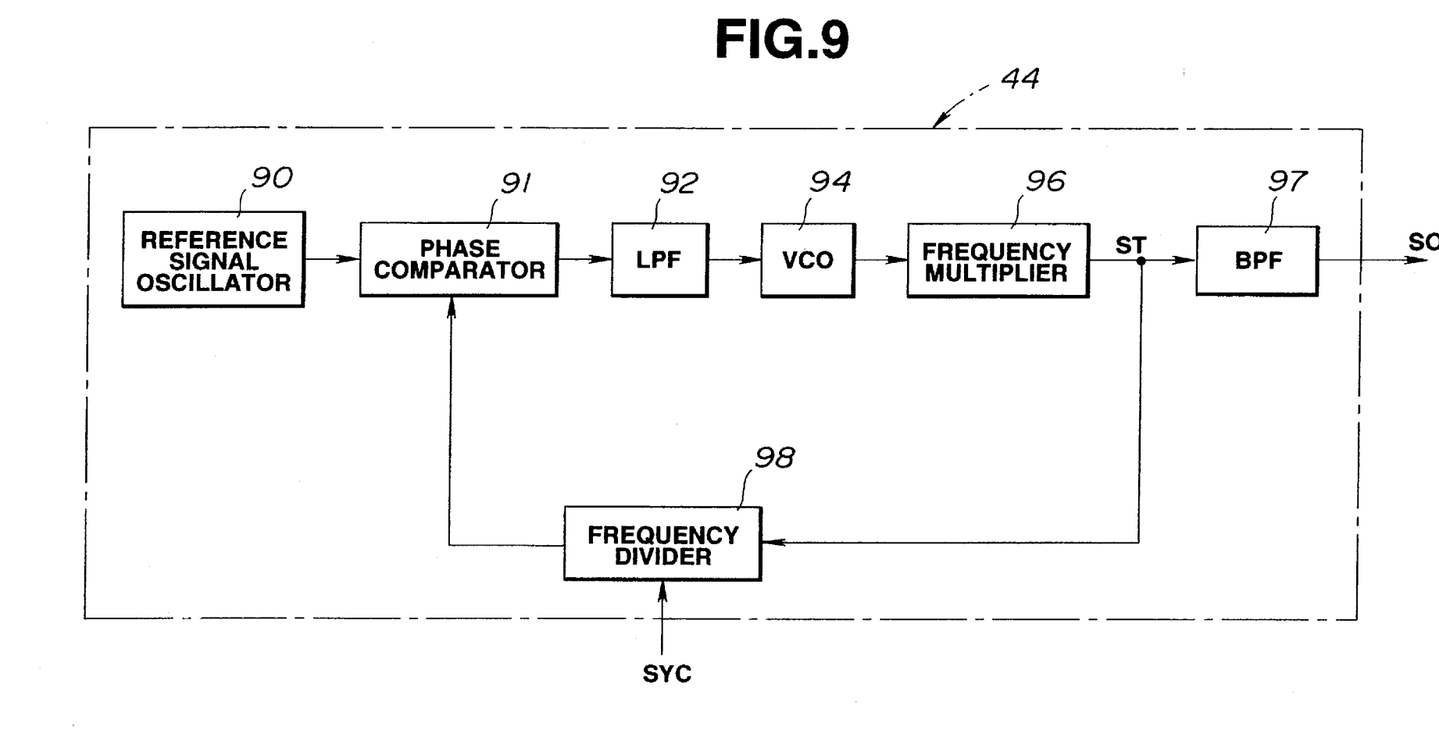
FIG. 9 is a block diagram showing a detailed arrangement of a frequency synthesizer according to a second illustrative embodiment of the invention.

FIG. 9 is a block diagram showing an arrangement of the frequency synthesizer 44 in the second embodiment of the invention. In FIG. 9, the frequency synthesizer 44 is identical to that of the first embodiment shown in FIG. 6 except that the former is further provided with and followed by a band pass filter (BPF) 97 for removing higher and lower frequency components from the frequency-multiplied signal and feeding an output oscillation signal SO to the receiver circuit 43 and the transmitter circuit 45 shown in FIG. 6.

Here, we discuss operation of the second illustrative embodiment in the following.

The operation of the reference signal generator 90 through the frequency multiplier 96 is the same as in case of the first embodiment and accordingly the explanation thereof will be omitted. A frequency-multiplied signal ST from the frequency multiplier 96 is fed to BPF 97 as well as the frequency divider 98. BPF 97 removes higher frequency components generated in the frequency multiplier 96 and lower frequency components such as noise from the frequency-multiplied signal ST and feed the filtered signal to the receiver circuit 43 and the transmitter circuit 45 shown in FIG. 6. Further, the frequency-multiplied signal ST the frequency of which is identical to the transmission frequency is supplied to the frequency divider 98, causing the frequency-divided version thereof to be fed to the phase comparator 91.

Therefore, the second embodiment enables quick shifts of frequency channels as in the first embodiment. Again, disturbance is hard to occur, which will occur when undesirable spurious or radio wave goes around into VCO 94 in the frequency synthesizer 44. Furthermore, BPF 97 has to have no particular characteristic to extract a signal of a predetermined frequency band from the signal ST. In other words, even if BPF 97 is not so low in the insertion loss or ripple levels nor does it has a flat frequency characteristic in the pass band, the PLL configuration (closed loop control) from the frequency divider 98 to the phase comparator 91 will normally operate without the frequency-multiplied signal level not lowering or varying. Thus, even the use of a widely used filter enables the PLL configuration (closed loop control) from the frequency divider 98 to the phase comparator 91 to operate normally. This eliminates the need for tailoring BPF 97, resulting in cost reduction.

Though the present invention has been described in terms of some illustrative embodiments, it is apparent to those of ordinary skill in the art that other various arrangements may be constructed without departing from the spirit and scope of the present invention. It should be therefore understand that the present invention is not limited to the specific embodiments described in the specification, but rather be construed broadly within its spirit and scope as set out in the appended claims.

Capability of Exploitation in Industry

As described above, a frequency synthesizer according to the present invention is vary useful for the application to a local oscillator etc. of a frequency converter in the receiver section and an oscillator of the transmitter section in a radio communication equipment for transmitting relatively large power.

We claim:

1. A frequency synthesizer comprising:

reference oscillator means for generating a reference oscillation signal;

phase comparing means for generating a phase error signal concerning said reference oscillation signal and a frequency-divided signal;

a loop filter operative on the basis of said phase error signal for generating and outputting a control voltage;

voltage-controlled oscillator means for generating an oscillation signal of a frequency responsive to said control voltage;

frequency-multiplying means for sending out a frequency-multiplied signal which is a frequency-multiplied version of said oscillation signal;

frequency-dividing means for frequency-dividing said frequency-multiplied signal to supply said frequency-divided signal to said phase comprising means; and a band pass filter for letting a predetermined frequency band of said frequency-multiplied signal pass as an output of the frequency synthesizer.

2. The frequency synthesizer as defined in claim 1 wherein said frequency multiplying means comprises:

an input resonance circuit which resonates said oscillation signal from said voltage-controlled oscillator means; and an amplifying and frequency-multiplying circuit for amplifying and frequency-multiplying a resonated oscillation signal from said input resonance circuit, said amplifying and frequency-multiplying circuit including:

an output resonance circuit which resonates said frequency-multiplied signal.

3. The frequency synthesizer as defined in claim 2 wherein:

said amplifying and frequency-multiplying circuit comprises a transistor.

4. The frequency synthesizer as defined in claim 2, wherein said amplifying and frequency-multiplying circuit comprises:

a semiconductor device for distorting said resonated oscillation signal from said input resonance circuit.

5. The frequency synthesizer as defined in claim 4 wherein:

said semiconductor device comprises a variable-capacitance diode.

6. The frequency synthesizer as defined in claim 1 wherein:

said frequency dividing means is so arranged as to down convert said frequency of said oscillation signal from said voltage-controlled oscillator means into one of a plurality of frequencies with constant spacing.

7. The frequency synthesizer as defined in claim 6 wherein:

said frequency dividing means is provided with setting means for setting said frequency of said oscillation signal for a desired one of said plurality of frequencies.

8. The frequency synthesizer as defined in claim 2, wherein:

said output resonance circuit comprises a series resonance circuit;

said output resonance circuit comprises a parallel resonance circuit; and said input and said output resonance circuit each comprises an inductor and a capacitor.

9. The frequency synthesizer as defined in claim 8 wherein:

said capacitor comprises a distributed capacitance in the circuit.

10. A radio communication apparatus having an antenna for receiving a radio signal, a frequency synthesizer for generating a local oscillation signal, demodulating means for demodulating said radio signal with said local oscillation signal and outputting a demodulated signal, and outputting means for outputting said demodulated signal, wherein said frequency synthesizer comprises:

reference oscillating means for supplying a reference oscillation signal;

phase comparator means for outputting a phase error signal between said reference oscillation signal and a frequency-divided signal;

a loop filter for producing a control voltage on the basis of said phase error signal;

voltage-controlled oscillator means for sending out an oscillation signal with a frequency responsive to said control voltage;

frequency multiplying means for frequency-multiplying said oscillation signal to send out said frequency-multiplied oscillation signal as said local oscillation signal;

frequency dividing means for frequency-dividing said frequency-multiplied oscillation signal and supplying said frequency-divided signal to said phase comparator means; and a band pass filter for letting a predetermined frequency band of said frequency-multiplied signal pass as said local oscillation signal.

* * * * *

UNITED STATES PATENT AND TRADEMARK OFFICE
CERTIFICATE OF CORRECTION

PATENT NO. : 5,568,098
DATED : October 22, 1996
INVENTOR(S) : Hiroshi HORIE et al.

It is certified that error appears in the above-indentified patent and that said Letters Patent is hereby corrected as shown below:

```
Title page, item 57, line 7, "An oscillated signal from is"
should read --An oscillated signal from the VCO(94) is--.
```

Signed and Sealed this

Eighteenth Day of March, 1997

Attest:

BRUCE LEHMAN

Attesting Officer     Commissioner of Patents and Trademarks